(12) United States Patent
Nguyen

(10) Patent No.: US 6,459,491 B1
(45) Date of Patent: *Oct. 1, 2002

(54) NON-INTRUSIVE PELLICLE HEIGHT MEASUREMENT SYSTEM

(75) Inventor: Phong T. Nguyen, Vancouver, WA (US)

(73) Assignee: Wafer Tech, Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/904,870

(22) Filed: Jul. 12, 2001

Related U.S. Application Data

(62) Division of application No. 09/524,999, filed on Mar. 14, 2000, now Pat. No. 6,245,193.

(51) Int. Cl.[7] .............................................. G01N 21/00
(52) U.S. Cl. ..................................... 356/604; 356/237.1
(58) Field of Search ............................ 356/237, 241.1, 356/622, 906, 614, 625, 630, 604; 250/559.45, 559.46, 559.47

(56) References Cited

U.S. PATENT DOCUMENTS 5,625,193 A * 4/1997 Broude et al. ............... 250/372
5,717,198 A * 2/1998 Broude et al. ............... 356/237
6,167,355 A * 12/2000 Fiekowsky ................... 356/241

FOREIGN PATENT DOCUMENTS

JP  403217843 A  9/1991  ............. G03F/1/08

OTHER PUBLICATIONS

"Laser Displacement Meters Ultra–Long Range–LK–2500 Series", Keyence Corporation Product Overview, 1999.
"Laser Displacement Meters–LK Series", Keyence Corporation Product Overview, 1999.

* cited by examiner

Primary Examiner—Frank G. Font
Assistant Examiner—Roy Punnoose
(74) Attorney, Agent, or Firm—George O. Saile; Stephen B. Ackerman

(57) ABSTRACT

A method to monitor a dimension of a pellicle includes projecting a first light signal against a surface of the pellicle. A second light signal reflected from the surface of the pellicle is detected, with the second light signal being a representation of the first light signal. The method determines if the dimension of the pellicle is within an allowable value based on a characteristic of the detected second light signal. The characteristic of the detected second light signal can include time periods between pulses of the detected second light signal, an intensity of the detected second light signal, or a positional displacement of the detected second light signal.

15 Claims, 4 Drawing Sheets

NON-INTRUSIVE PELLICLE HEIGHT MEASUREMENT SYSTEM

This application is a divisional of U.S. Pat. Application Ser. No. 09/524,999, entitled "NON-INTRUSIVE PELLICLE HEIGHT MEASUREMENT SYSTEM," filed Mar.14, 2000, now U.S. Pat. No. 6,245,193.

BACKGROUND OF THE INVENTION

1. Field of the Invention

The present invention relates generally to integrated circuit fabrication tools, and more particularly, relates to a method and apparatus to measure pellicle height.

2. Background Information

Photolithography is a process that is commonly used in the manufacture of integrated circuits. The process involves the deposition of a photoresist layer onto an underlying substrate layer. The photoresist is then selectively exposed to light, which chemically alters the photoresist. If the photoresist is a positive type, then areas where the photoresist are exposed to light are selectively removed order to obtain the circuit pattern.

The pattern that is projected onto the photoresist is contained on a mask placed. within a photolithography exposure tool or stepper. A stepper includes a light source, stepper controller (e.g., an aligner), and a reticle table. A mask, also referred to as a reticle, is placed on the reticle table between the light source and the photoresist layer. The reticle is typically formed from an opaque film of patterned chromium placed on a transparent blank typically made of a glass or quartz material. The pattern is transferred onto the photoresist by projecting an image of the reticle onto the photoresist using an exposing radiation from the light source. In this manner, the pattern of opaque chromium placed on the transparent blank defines the areas through which the exposing radiation passes, thereby exposing selective regions of the underlying photoresist.

The patterned chromium film on the reticle blank includes lines and line spacings of less than 10 microns. Depending on a reduction factor, line width, and line spacing, geometries for a resulting semiconductor device can range from less than 10 microns to less than two microns. When working with such small geometries, it is important that the reticle and other components in the fabrication processes be free of contamination. Even the smallest piece of foreign contamination can produce an image on the photoresist.

Therefore, in many applications, the reticle is covered by a pellicle. A pellicle (sometimes referred to as a pellicle membrane) is a thin film of optical grade polymer that is stretched on a pellicle frame and secured to the reticle. The pellicle frame is often made of a rigid and durable material, such as aluminum, so that the fragile pellicle may be handled during transport or during the photolithography process without damage. The pellicle's purpose is to prevent airborne contaminants from collecting on the mask. During the exposure, the pellicle holds the contaminants out of the focal plane, and hence, the contaminants do not print on the wafer.

Complex circuit patterns typically require multiple exposure and development steps. In some instances, multiple copies of circuit patterns are repeatedly projected onto different surface regions on a single wafer, thereby allowing several identical integrated chips to be manufactured from the same wafer. The wafer is then subsequently cut into a plurality of identical, individual chips. In the case of a large circuit pattern, sections of the pattern may be exposed and developed individually rather than the circuit pattern as a whole. The stepper controller controls the movement and positioning of the reticle as it moves across different regions of a wafer during the photolithography process.

Because of these complex or multiple patterns, reticles in the stepper often have to be repeatedly switched or removed during the photolithography process. Removal of a reticle may also be required if a "worn out" reticle (e.g., a reticle distorted in some manner due to damage, heavy use, or dirt accumulation) needs to replaced by another reticle.

Because the pellicle-reticle assembly is continuously being exposed to the light source and because of other factors present in the photolithography process, the pellicle (including the pellicle frame) and the reticle can heat up. The heat causes these components to expand, which can have very detrimental effects when these components are repeatedly removed from or inserted into the stepper as mentioned above. That is, the expanded size could undesirably result in contact between the pellicle and a component of the stepper (such as optical machinery) when the pellicle-reticle assembly is removed from the stepper. This contact can scratch fragile components of the stepper or damage the pellicle. Scratched stepper components can result in out-of-focus imaging or improper positioning of the reticle, which ultimately decreases die yield and productivity. A scratched pellicle can introduce contaminants onto the reticle image. Furthermore, replacement of a damaged pellicle and reticle assembly can be expensive, especially if several wafers are exposed and developed before the damage to the pellicle is uncovered.

Accordingly, there is a need to be able determine the height of a pellicle to determine if it has exceeded acceptable tolerances.

SUMMARY OF THE INVENTION

According to one aspect of the invention, a method for monitoring a dimension of a pellicle includes projecting a first light signal against a surface of the pellicle. A second light signal reflected from the surface of the pellicle is detected, with the second light signal being a representation of the first light signal. The method determines if the dimension of the pellicle is within an allowable value based on a characteristic of the detected second light signal.

BRIEF DESCRIPTION OF DRAWINGS

Non-limiting and non-exhaustive embodiments of the present invention will be described in the following figures, wherein like reference numerals refer to like parts throughout the various views unless otherwise specified.

DETAILED DESCRIPTION OF THE ILLUSTRATED EMBODIMENTS

Embodiments of an apparatus and method for non-intrusive pellicle height measurement are described in detail herein. In the following description, numerous specific details are provided, such as the description of components of a stepper, such as that shown in FIGS. 4 and 5, to provide a thorough understanding of embodiments of the invention. One skilled in the relevant art will recognize, however, that the invention can be practiced without one or more of the specific details, or with other methods, components, etc. In other instances, wellknown structures or operations are not shown or described in detail to avoid obscuring aspects of various embodiments of the invention.

Figure 1:
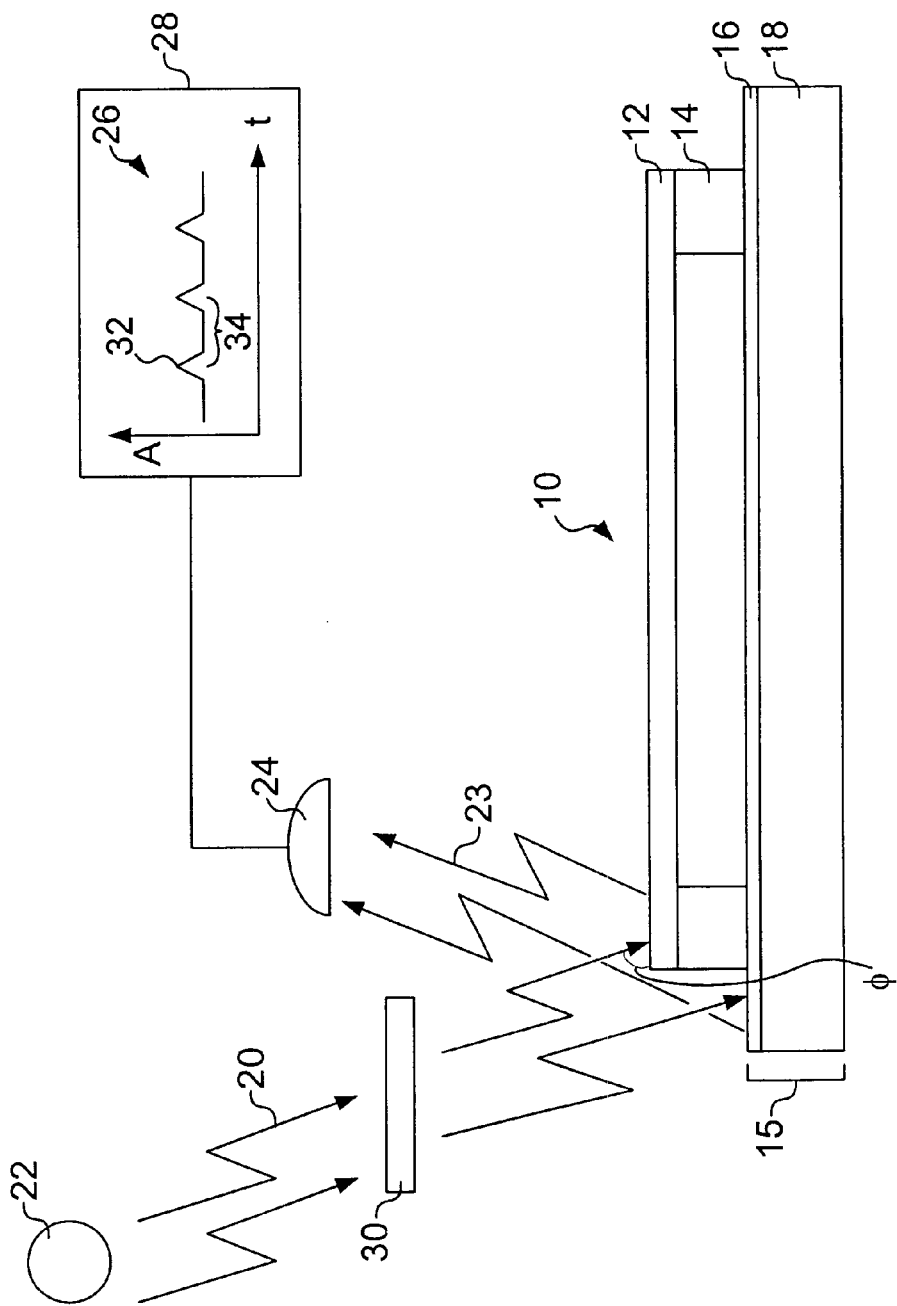
FIG. 1 shows a method and apparatus to measure pellicle height according to an embodiment of the invention.

Referring first to FIG. 1, an embodiment of an apparatus and method for non-intrusively measuring pellicle height is shown. A pellicle-reticle assembly 10 includes a pellicle membrane 12 mounted (e.g., glued) onto a pellicle frame 14. A reticle 15 includes a chromium pattern 16 placed on a blank 18. The pellicle frame 14 and pellicle membrane 12 are positioned over and attached to the reticle 15 such that the pellicle membrane 12 keeps foreign particles off the focal plane of the pattern 16.

According to conventional configurations and materials, the pellicle membrane 12 can be an optical grade, transparent polymer, such as nitrocellulose or cellulose acetate, having a thickness of 0.8 to 2.5 microns, for example. The pellicle frame can be made of a suitable rigid material, such as aluminum. The combined thickness of the pellicle membrane 12 and pellicle frame 14 can vary between 4.5 and 5.5 mm, although as previously discussed above, this thickness tends to increase as these component heat up during use.

Also according to conventional configurations and materials, the pattern 16 can be made of an opaque material, such as chromium, and it is understood that persons skilled in the art can choose other types of materials that are suitable for use as a mask. The pattern 16 can have a thickness 100 nm or less. The blank 18 can be made from glass, quartz, soda lime, borosilicate glass, fused silica, or other sufficiently transparent material. A suitable thickness of the reticle 15 can be 0.25 inches, and with an overall surface area of 6 square inches. Again, the thickness of the reticle 15 (e.g., the thickness of both the pattern 16 and the blank 18) can increase during use as the reticle 15 heats up.

Because the blank 18 is transparent, while the pattern 16 has both opaque and nonopaque surfaces/regions, light that is incident on the non-opaque surfaces of the pattern 16 will tend to pass through and light that is incident on the opaque surfaces of the pattern 16 will tend to be reflected. Similar principles apply to the pellicle membrane 12 and the pellicle frame 14. That is, because the pellicle frame 14 is opaque, while the pellicle membrane 12 is transparent, light that is incident on surfaces of the pellicle membrane 12 that overly the pellicle frame 14 will tend to be reflected.

Therefore, according to an embodiment of the invention, such as that shown in FIG. 1, a light source 22 is positioned over the pellicle-reticle assembly 10 and generates a first light signal 20, which is aimed incident to a surface/region of the pellicle membrane 12 that overlies the pellicle frame 14. The first light signal is then reflected off the pellicle-reticle assembly 10 as a second light signal 23. The second light signal 23 is in turn sensed by a detector 24 positioned above the pellicle-reticle assembly 10. The detector 24 can comprise one or more photodiodes, phototransistors, or other similar devices that can detect the presence or absence of light during a period of time (e.g., detect whether a light is "on" or "off") or that can detect varying intensities of light, and then subsequently convert the detected light into one or more electronic signals 26 representative of the on-off state or the intensity of the detected light. As will be described in further detail below, the electronic signals 26 can used by a controller unit 28, as shown symbolically in FIG. 1, to determine dimensional changes of the pellicle-reticle assembly 10.

An angle of incidence + of the first light signal 20 can be any suitable angle such that the second light signal 23 can be reflected towards a location where the detector 24 is positioned. For example, the angle of incidence+ can be between 30 and 60 degrees. The first light signal 20 can comprise laser light or another type of light that can be focused in a directional manner. For example, one or more lightemitting diodes (LEDs) may be used as the light source 22.

Additionally, the first light signal 20 can also be made incident to the pattern 16 of the reticle 15, such that the second light signal 23 is reflected from the surface of the reticle 15 towards the detector 24. In this manner, the illustrated embodiment of the detector 24 can detect the second light signal 23 reflected from the pellicle frame 14 (and pellicle membrane 12), from the reticle 15, or both.

In operation, a chopper 30 is used in conduction with the light source 22 and the first light signal 20. As is known in the art, choppers are devices to interrupt a light signal at regular intervals. The chopper 30 can be, for example, a rotating, propeller-shaped element. In this embodiment, the chopper 30 rotates at a known speed, such that at specific instances of time, the first light signal 20 passes between blades of the rotating chopper 30, while at the other times, the first light signal 20 is blocked by the rotating blades. According to one embodiment, the chopper 30 can rotate at a speed within the kilohertz regime. The pulse(s) of the first light signal 20 that pass through the chopper 30 are reflected from the pellicle-reticle assembly 10 in the form of the second light signal 23. That is, the second light signal 23 appears to the detector 24 as a series of light pulses rather than as a continuous light beam. The detector 24 detects these pulses and generates the electronic signal 26, such that the electronic signal 26 has a plurality of peaks 32 spaced from each other by time periods 34. The peaks 32 correspond to the detected pulses of the second light signal 23 (e.g., "light on" periods), while the non-peak periods between the peaks 32 correspond to the "light off" periods when the chopper 30 blocks the first light signal 20.

Accordingly, the time periods 34 between the peaks 32 can represent the total time it takes for a pulse of light to travel from the light source 22 to the pellicle membrane 12, and then to the detector 24. The time periods 34 can also represent the time it takes for a pulse of light to travel from the pellicle membrane 12 to the detector 24. Because the distance between the detector 24 and the pellicle membrane 12 (in particular, the pellicle frame 14) will decrease as the pellicle-reticle assembly 10 heats up and expands during use, the time periods 34 between the peaks 32 will also correspondingly decrease, due to the decreased distance that a light pulse travels. As such, the controller unit 28 can process the electronic signal 26 to determine dimensional changes in the pellicle-reticle assembly 10 by, for example, detecting the changes in the time periods 34 from one reading to another.

Another method of determining the height of the pellicle frame 14 is to detect time differences of pulses, at the detector 24, between: 1) the second light signal 23 reflected from the reticle 15, and 2) the second light signal 23 reflected from the pellicle frame 14 (and/or pellicle membrane 12). That is, because the surface of the reticle 15 is more distant from the detector 24 than the surface of the pellicle frame 14, the time periods 34 corresponding to the second light signal 23 reflected from reticle 15 will be greater than the time periods 34 corresponding to the second light signal 23 reflected from the pellicle frame 14. The difference between these time periods, as determined by the controller unit 28, will thus correlate to the thickness of the pellicle frame 14.

While the embodiments have been described above as detecting "time differences" between various signals, it is understood that the time periods 34 are a representation of the frequency of the electronic signal 26. As such, an embodiment of the invention can measure changes in frequency of the electronic signal 26. That is, for example, a first frequency can be initially determined for a second light signal 23 reflected off the reticle 15. Then, a second frequency can be determined for a second light signal 23 reflected off the pellicle frame 14. The differences in frequencies can be correlated to dimensional changes of the pellicle-reticle assembly 10. For instance, one embodiment can compare measured/calculated frequency changes with known frequency changes (e.g., stored in a look-up table) that correspond to default and maximum-allowed dimensions of the pellicle-reticle assembly 10.

While a rotating, propeller-shaped chopper 30 has been described herein, it is understood that other types of chopper implementations may be utilized. For example, turning the light source 22 "on" or "off" at a specific frequency, through the use of appropriate switching and without the use of a separate chopper 30, can achieve the same effect as transmitting the first light signal 20 through a propellershaped chopper 30. Thus, embodiments of the invention are not limited by the specific type of chopper implementation used.

Additionally, while FIG. 1 only shows a single light source 22 and shows only one location on the surfaces of the pellicle-reticle assembly 10 that receives the incident first light signal 20, it is understood that any number of lights sources 22 may be used to direct the first light signal 20. The first light signal 20 can be directed at multiple locations on any of the surfaces of the pellicle-reticle assembly 10, in the event that regions of the pellicle-reticle assembly 10 may have uneven thermal expansion and as such, may require measurements at different locations.

Figure 2:
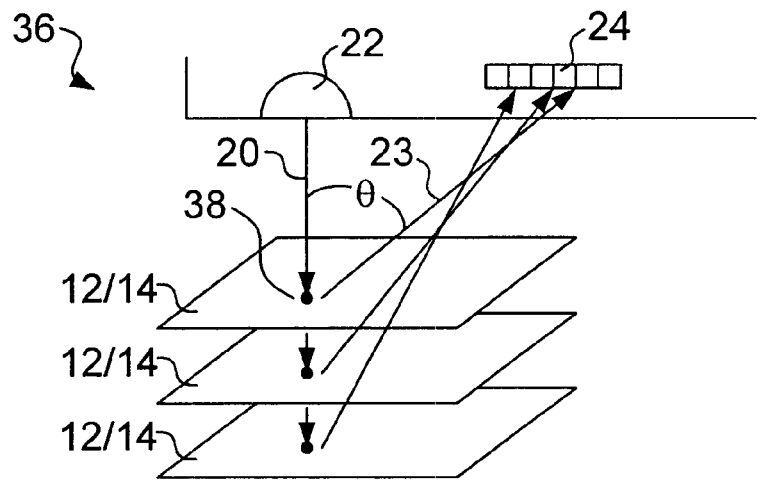
FIG. 2 shows a method and apparatus to measure pellicle height according to another embodiment of the invention.

Another embodiment of the invention is shown in FIG. 2. According to this embodiment, an apparatus 36 includes the light source 22 and the detector 24, which can be an array of discrete photosensitive elements, for example. In the embodiment shown in FIG. 2, the first light signal 20 is directed perpendicularly to a location 38 on the surface of the pellicle membrane 12 (and/or pellicle frame 14). The pellicle membrane 12 (and/or pellicle frame 14) act as a diffraction grating to scatter light. That is, the first light signal 20 is reflected off the location 38 at an angle θ as the second light signal 23. The second light signal 23 is then detected by one of the photosensitive elements in the detector 24. The apparatus 36 can include one or more lenses (not shown) to properly focus the second light signal towards one of the photosensitive elements. As evident in FIG. 2, changes in the height/thickness of the pellicle membrane 12 (and/or pellicle frame 14) results in changes in the angle θ. The angle θ approaches 90 degrees from vertical as the pellicle membrane 12 (and/or pellicle frame 14) increase in thickness. The changes in the angle θ results in the detection of the second light signal 23 by photosensitive elements in the detector 24 at different incremental locations along the array. These positional changes of activated photosensitive elements correlate to the change in thickness of the pellicle membrane 12 (and/or pellicle frame 14).

Figure 3:
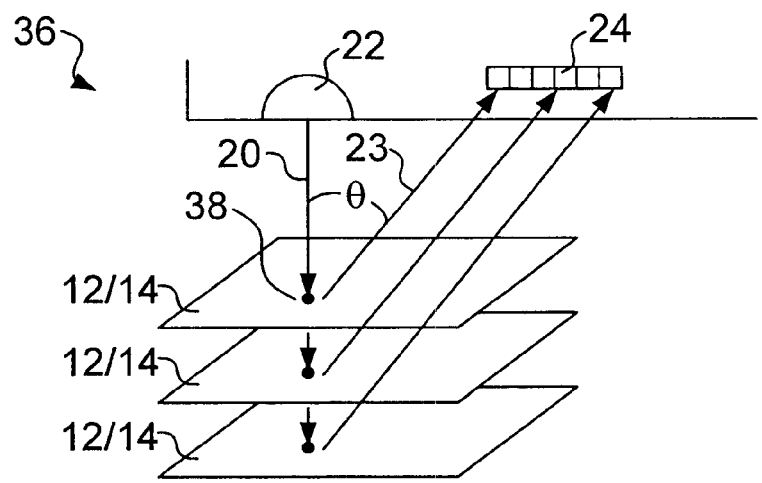
FIG. 3 shows a variation of the embodiment of the method and apparatus to measure pellicle height of FIG. 2.

FIG. 3 shows a slight modification to the embodiment shown in FIG. 2. FIG. 3 is intended to illustrate an embodiment where the angle θ remains constant as the pellicle membrane 12 (and/or pellicle frame 14) increase in thickness. In such a situation, the second light signal 23 is also detected at different incremental locations by the array of photosensitive elements in the detector 24. As with the embodiment of FIG. 2, these changes in incremental locations can be correlated to changes in thicknesses of the pellicle membrane 12 (and/or pellicle frame 14).

Figure 4:
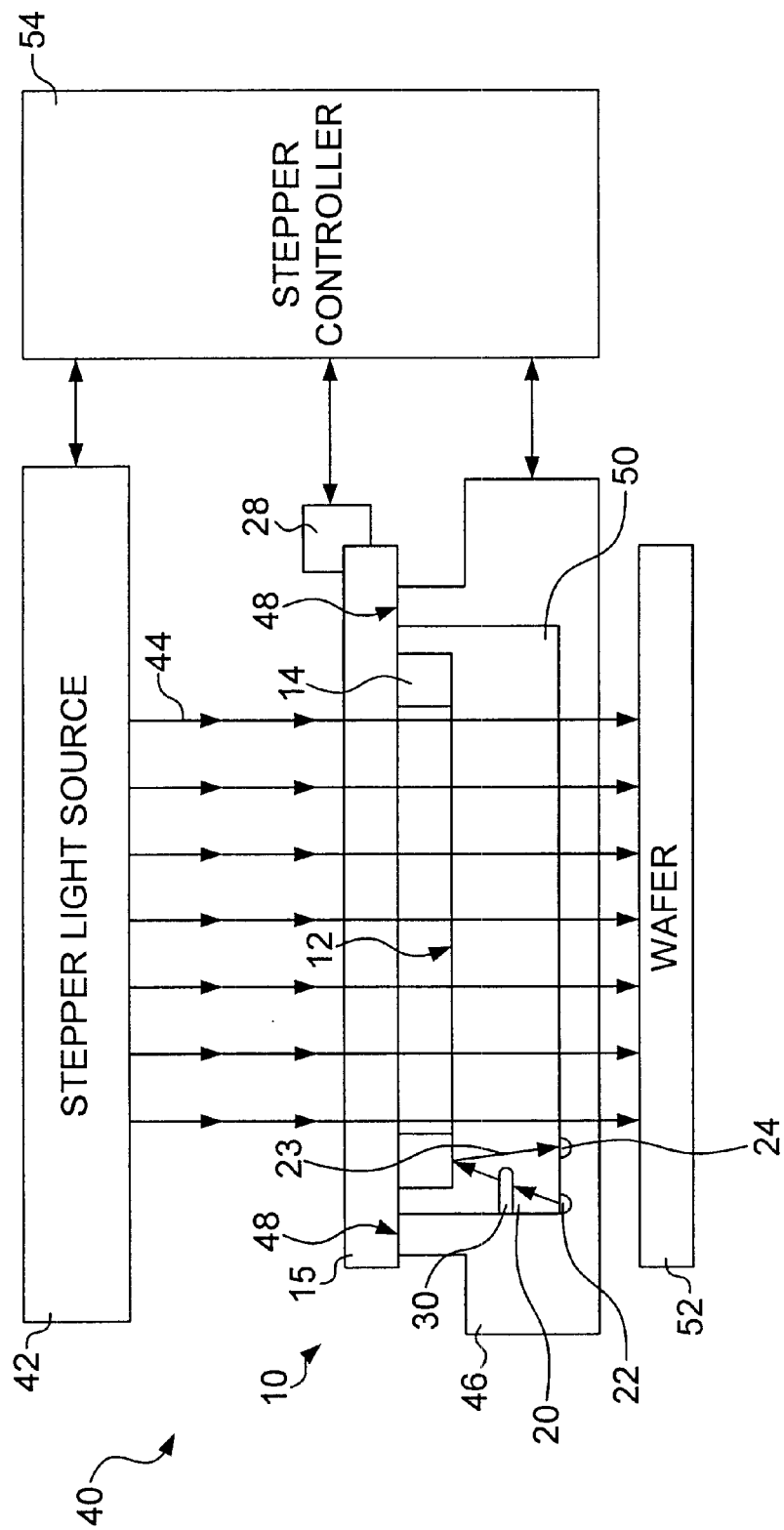
FIG. 4 shows how the embodiment of FIG. 1 can be implemented in a photolithography device.

Referring next to FIG. 4, shown generally at 40 is a stepper or other photolithography device that can implement the embodiments described above. The stepper 40 includes a stepper light source 42 to generate light 44 for the photolithography process. One or more optical lenses (not shown) may be positioned under the stepper light source 42. The pellicle-reticle assembly 10, comprised of the reticle 15 and the pellicle frame 14 (having the pellicle membrane 12 attached thereto), is mounted on a reticle table 46. In the embodiment shown in FIG. 4, the reticle 15 sits on surface(s) 48 of the reticle table 46. Other embodiments and configurations other than what is shown in FIG. 4 are possible. For example, while FIG. 4 shows the pellicle-reticle assembly 10 having the reticle positioned between the stepper light source 42 and the pellicle frame 14, it is possible to have applications where the pellicle-reticle assembly 10 is oriented such that the pellicle frame 14 is between the stepper light source 42 and the reticle 15.

In the embodiment shown in FIG. 4, the light 44 passes through the pellicle-reticle assembly 10, then through an opening 50 in the reticle table 46, and onto a semiconductor wafer 52. As can be seen, the pellicle frame 14 and the pellicle membrane 12 are positioned within the opening 50. A stepper controller 54 controls the relative positioning of the stepper light source 42 and the reticle table 46.

According to conventional steppers and processes as described above, the pellicle-reticle assembly 10 heats up and expands while in use, which 12 can result in undesirable contact between the reticle table 46 and the pellicle frame 14 or the pellicle membrane 12. Specifically, if the pellicle frame 14 has expanded during use, the expansion may exceed designed space tolerances, therefore causing the pellicle frame 14 to contact and scratch the surface(s) 48 (or other surfaces, such as surfaces of optical components) of the reticle table 46 when the pellicle-reticle assembly 10 is lifted above and moved off the reticle table 46. The scratched surface(s) 48 of the reticle table 46 can result in improper positioning of subsequent reticles 15 that are placed on the reticle table 46, thereby resulting in poor image focusing. Additionally, contact with the surfaces 48 (or with other surfaces) can result in scratches or other damage to the pellicle frame 14 or to the fragile pellicle membrane 12.

Accordingly, an embodiment of the invention positions the light source 22, chopper 30, and detector 24 in the opening 50 of the reticle table 46 in a manner shown in FIG. 4, such that the principle of operation illustrated in FIG. 1 can be implemented. In this manner, the first light signal 20 is projected through the chopper 30 and is incident on the surfaces of the pellicle-reticle assembly 10, and then the reflected pulses of the second light signal 23 are detected by the detector 23. Through conductive lines (not shown), the electrical signal 26 (see, e.g., FIG. 1) generated by the detector 24 are transmitted to the controller unit 28.

The light source 22, detector 24, and chopper 30 are suitably electrically connected to and controlled by the stepper controller 44, controller unit 28, or other controller (not shown). In this manner, light detection, generation of the electrical signal 26, comparison of time periods 34 between peaks 32, and other functions described above can be implemented and used to control operation of the stepper 40.

The controller unit 28 is communicatively coupled to the stepper controller 54, such that the upward and downward movement of the pellicle-reticle assembly 10, as it is positioned on and lifted out of the reticle table 36, can be controlled based on the dimensional characteristics of the pellicle-reticle assembly 10. That is, if the detector 24 and the controller unit 28 determine that dimensional tolerances of the pellicle-reticle assembly 10 have been exceeded (due to heat expansion), then the stepper controller 54 can inhibit or stop further operation until the thickness of the pellicle-reticle assembly 10 has fallen back to acceptable dimensional tolerances.

Figure 5:
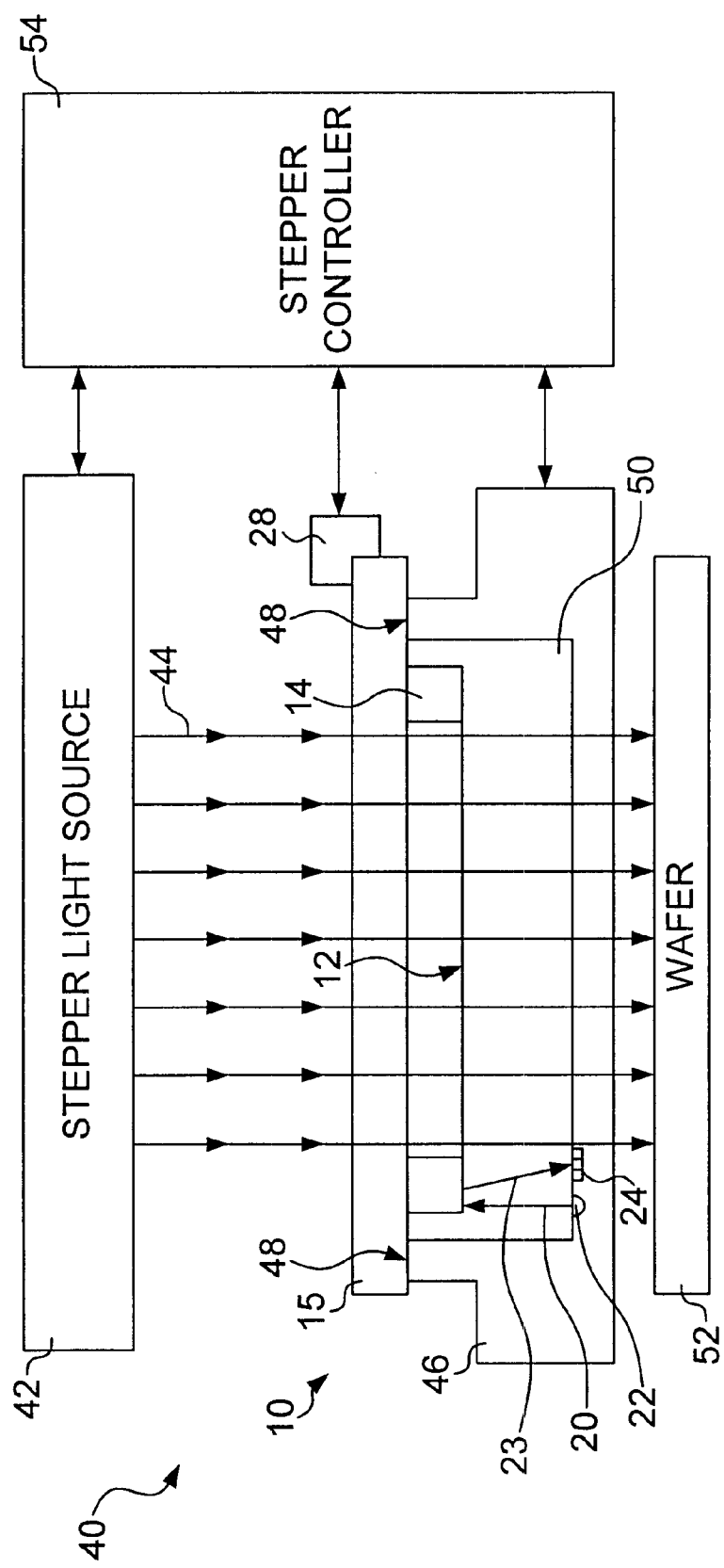
FIG. 5 shows how the embodiments of FIGS. 2 and 3 can be implemented in a photolithography device.

FIG. 5 shows an implementation corresponding to the embodiments shown in FIGS. 2 and 3. In FIG. 5, the light source 22 and array of photosensitive elements of the detector 24 are also arranged within the opening 50 of the reticle table 46. The light source 22 and detector 24 are electronically connected to the controller unit 28 and/or to the stepper controller 54 such that measurement operations can be controlled and such that operation of the stepper 40 can be controlled based on information representative of the dimensional changes of the pellicle-reticle assembly 10.

As previously mentioned above, multiple light sources 22 and/or detectors 24 can be positioned in the reticle table 46 in the embodiments shown in FIGS. 4 and 5 such that light measurement readings can be made against different surface regions of the pellicle-reticle assembly 10. Additionally, in embodiments where the pellicle frame 14 is positioned between the stepper light source 42 and the reticle 15, it is understood that the light source 22, chopper 30, and detector 23 may be located in a location different from the opening 50 in the reticle table 46. A suitable location can be just below the stepper light source 42, so as not to interfere with the path of the light 44. Accordingly, embodiments of the invention are not limited by the specific number or position of light sources 22 or detectors 24 used.

To aid in the performance of the embodiments shown in FIGS. 4 and 5, a calibration procedure may be used. For example, when a pellicle-reticle assembly 10 is first placed in the stepper 40 (e.g., before any heat expansion has occurred), light measurement readings may be taken and then stored (e.g., in a lookup table). This becomes a default or base value. From this value, maximum expansion tolerances may be calculated. According to one method that can be used for the embodiments shown in FIGS. 1 and 4, if it is known that the maximum allowable expansion of the pellicle frame 14 is 2 mm, then a numerical value of the time periods 34 may be calculated that corresponds to this dimensional increase. This calculated numerical value can then be stored in the lookup table and used as a benchmark during actual measurement operations.

According to a calibration method that can be used for the embodiments shown in FIGS. 2–3 and 5, the pellicle-reticle assembly 10 is first placed in the stepper 40, before heat expansion, and then the first light signal 20 and the second light signal 23 are generated, thereby activating a photosensitive element in the detector 24 corresponding to this default measurement. The position of this photosensitive element is noted and stored in a lookup table, and geometric calculations can be performed to correlate the positions of other photosensitive elements in the detector with changes in height of the pellicle frame 14. These calculated positions of the photosensitive elements can also be stored in the lookup table and used during actual measurement operations.

According to yet another embodiment of a calibration method, the default (e.g., non-expanded) and maximum-allowed (e.g., fully expanded to tolerance limits) dimensions of the pellicle-reticle assembly 10 can be explicitly measured and stored in a lookup table or in other storage media, rather than calculated. A possible way to implement this calibration is to insert a non-expanded pellicle-reticle assembly 10 into the stepper 40 and take a first set of light measurements, such as time or frequency measurements. Then, to obtain a subsequent second set of light measurements corresponding to a maximum-expanded pellicle-reticle assembly 10, a "dummy" pellicle-reticle assembly 10 may be inserted into the stepper 40, with the "dummy" having the maximum-allowed dimensional size. The first and second sets of frequency/time measurements are then stored in the lookup table and can be used as benchmarks.

Embodiments of the invention thus provide a non-intrusive pellicle height measurement method, apparatus, and system. The various described embodiments provide an automatic technique to measure thicknesses in situ, while the pellicle-reticle assembly 10 is still in the stepper 30. Accordingly, pellicle-related defects, such as damage to the stepper 30 or to the pellicle membrane 12, can be significantly curtailed.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For example, although measurement of pellicle height has been described herein, it is to be appreciated that other embodiments of the invention can use principles of the invention to measure reticle height or the combined height of both the reticle and the pellicle in a pellicle-reticle assembly.

As another example of a modification, the detector 24 can generate the electrical signal 26 based on intensity of the second light signal 23, rather than based on time periods 34 between peaks. In this alternative embodiment, the second light signal 23 will have different intensities based on the distance from the pellicle frame 14 to the detector 24. With expansion, the pellicle frame 14 moves closer to the detector 24, resulting in a higher intensity of light detected at the detector 24. In this fashion, suitable intensity indexes of the detected light can be generated by the detector 24 and then matched with known indexes (e.g., taken from a lookup table) corresponding to dimensional tolerances.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for monitoring a dimension of a pellicle, the method comprising:

projecting a first light signal against a surface of the pellicle to cause the first light signal to be reflected from that surface;

detecting the first light signal reflected from the surface of the pellicle as a second light signal,; the second light signal being a representation of the first light signal; and determining if the dimension of the pellicle is within an allowable value based on a characteristic of the detected second light signal.

2. The method of claim 1 wherein determining if the dimension of the pellicle is within the allowable value comprises:

detecting an intensity of the second light signal;

generating an index corresponding to the detected intensity of the second light signal; and matching the generated index with a known index to correlate the dimension of the pellicle with a known dimension.

3. The method of claim 1 wherein projecting the first light signal comprises using a chopper to interrupt the first light signal, the second light signal comprising pulses of the interrupted first light signal reflected from the surface of the pellicle, the method further comprising:

transforming the detected second light signal into an electrical signal having peaks corresponding to the pulses;

determining a change in time periods between the peaks of the electrical signal; and correlating the change in time periods with a change in the dimension of the pellicle.

4. The method of claim 1, further comprising:

projecting the first light signal against a surface of a reticle disposed adjacent to the pellicle;

detecting the second light signal reflected from the surface of the reticle, the second light signal being a representation of the first light signal;

comparing a time period of an electronic representation of the second light signal reflected from the reticle with a time period of an electronic representation of the second light signal reflected from the pellicle;

deriving the dimension of the pellicle based on the compared time periods.

5. The method of claim 1 wherein determining if the dimension of the pellicle is within the allowable value based on a characteristic of the detected second light signal comprises detecting positional displacements of the detected second light signal, the detected positional displacements corresponding to changes in the dimension of the pellicle.

6. The method of claim 1, further comprising:

performing a calibration procedure, the calibration procedure including storing a first value corresponding to a default dimension of the pellicle and storing a second value corresponding to a maximum dimension of the pellicle, the first and second values corresponding to limits of the allowable value;

obtaining a third value corresponding to an operational dimension of the pellicle by detecting the second light signal reflected from the surface of the pellicle; and determining whether the third value is between the stored first and second values.

7. The method of claim 1 wherein projecting the first light signal comprises intermittently activating and deactivating a light-emitting source.

8. The method of claim 1, further comprising positioning, within a photolithography device, the pellicle, a light source to project the first light signal, and a detector to detect the second light signal, wherein whether the dimension of the pellicle is within the allowable value is determinable while the pellicle is positioned within the photolithography device.

9. The method of claim 1, further comprising using a rotating chopper to interrupt the first light signal, the chopper having gaps between blades to pass portions of the first light signal while the chopper rotates.

10. An apparatus to monitor a dimension of a photolithography element, the apparatus comprising:

a light source positionable above a surface of the photolithography element, the light source operative to project a first light signal against the surface to cause the first light signal to be reflected from that surface;

a detector unit positionable above the surface of the photolithography element at a location different from a location of the light source, the detector unit operative to detect the first light signal reflected from the surface of the photolithography element as a second light signal; and a controller unit operative to determine if the dimension of the photolithography element is within an allowable value based on a characteristic of the detected second light signal.

11. The apparatus of claim 10, further comprising a chopper disposed between the light source and the surface of the photolithography element, the chopper operative to interrupt the first light signal, the second light signal comprising pulses representative of the interrupted light signal projected against the surface, the detector unit operative to transform the pulses of the second light signal into an electrical signal having peaks corresponding to the pulses, the controller unit operative to determine a change in time periods between the peaks and to correlate a change in the time periods with a change in the dimension of the photolithography element.

12. The apparatus of claim 10 wherein the detector unit is operative to detect an intensity of the second light signal, the controller unit generating an index corresponding to the detected intensity and to match the generated index with a known index to correlate the dimension of the photolithography element with a known dimension.

13. The apparatus of claim 10 wherein the detector unit comprises a plurality of photosensitive elements arranged in an array, each one of the plurality of photosensitive elements being capable of activation if the second light beam is detected by that photosensitive element, wherein activation of different ones of the photosensitive elements in the array corresponds to dimensional changes of the photolithography element.

14. The apparatus of claim 10 wherein the photolithography element comprises a pellicle frame.

15. The apparatus of claim 10 wherein the light source comprises an intermittently activated light-emitting device.

* * * * *

UNITED STATES PATENT AND TRADEMARK OFFICE
CERTIFICATE OF CORRECTION

PATENT NO. : 6,459,491 B1
DATED : October 1, 2002
INVENTOR(S) : Phong T. Nguyen

It is certified that error appears in the above-identified patent and that said Letters Patent is hereby corrected as shown below:

<u>Title page,</u>
Item [73], Assignee, delete "Wafer Tech" and insert therefor -- WaferTech --; and
Item [62], Related U.S. Application Data, delete "6,245,193" and insert therefor
-- 6,346,986 --.

Signed and Sealed this

Twelfth Day of August, 2003

JAMES E. ROGAN
*Director of the United States Patent and Trademark Office*